: US 11,232,804 B2

United States Patent
Biswas et al.

(10) Patent No.: US 11,232,804 B2
(45) Date of Patent: Jan. 25, 2022

(54) LOW COMPLEXITY DENSE TRANSIENT EVENTS DETECTION AND CODING

(71) Applicant: Dolby International AB, Amsterdam Zuidoost (NL)

(72) Inventors: Arijit Biswas, Schwaig bei Nuernberg (DE); Michael Schug, Erlangen (DE); Harald Mundt, Fürth (DE)

(73) Assignee: Dolby International AB, Amsterdam Zuidoost (NL)

( * ) Notice: Subject to any disclaimer, the term of this patent is extended or adjusted under 35 U.S.C. 154(b) by 0 days.

(21) Appl. No.: 16/628,235

(22) PCT Filed: Jul. 3, 2018

(86) PCT No.: PCT/EP2018/067970
§ 371 (c)(1),
(2) Date: Jan. 2, 2020

(87) PCT Pub. No.: WO2019/007969
PCT Pub. Date: Jan. 10, 2019

(65) Prior Publication Data
US 2020/0126572 A1    Apr. 23, 2020

Related U.S. Application Data

(60) Provisional application No. 62/528,198, filed on Jul. 3, 2017.

(30) Foreign Application Priority Data

Jul. 3, 2017  (EP) ..................... 17179316

(51) Int. Cl.
*G10L 19/025*   (2013.01)
*G10L 19/032*   (2013.01)
(Continued)

(52) U.S. Cl.
CPC .......... *G10L 19/025* (2013.01); *G10L 19/032* (2013.01); *G10L 19/18* (2013.01);
(Continued)

(58) Field of Classification Search
CPC ....... G10L 19/025; H04B 1/665; H04H 20/88
See application file for complete search history.

(56) References Cited

U.S. PATENT DOCUMENTS 5,285,498 A * 2/1994 Johnston ................ H04B 1/665
                                                      381/2
7,191,121 B2 * 3/2007 Liljeryd .............. G10L 19/0208
                                                     704/200
(Continued)

FOREIGN PATENT DOCUMENTS

AU   2012208987 B2   8/2012
EP        1074976    2/2001
(Continued)

OTHER PUBLICATIONS

H. Thornburg, "Detection and Modeling of Transient Audio Signals With Prior Information," PhD dissertation, Stanford University, 2005. (Year: 2005).*

(Continued)

*Primary Examiner* — Feng-Tzer Tzeng

(57) ABSTRACT

The present disclosure relates to methods and apparatus for audio coding. A method of encoding a portion of an audio signal comprises determining whether the portion of the audio signal is likely to contain dense transient events, and if it is determined that the portion of the audio signal is likely to contain dense transient events, quantizing the portion of the audio signal using a quantization 5 mode that applies a substantially constant signal-to-noise ratio over frequency for the portion of the audio signal. The present disclosure (Continued)

further relates to a method of detecting dense transient events in a portion of an audio signal.

21 Claims, 13 Drawing Sheets

(51) Int. Cl.
G10L 19/18 (2013.01)
H03M 7/30 (2006.01)
H04B 1/66 (2006.01)
H04H 20/88 (2008.01)

(52) U.S. Cl.
CPC ....... *H03M 7/3059* (2013.01); *H03M 7/6011* (2013.01); *H04B 1/665* (2013.01); *H04H 20/88* (2013.01)

(56) References Cited

U.S. PATENT DOCUMENTS

| | | | |
|---|---|---|---|
| 7,302,451 | B2 | 11/2007 | Radhakrishnan |
| 8,116,459 | B2 | 2/2012 | Disch |
| 8,825,188 | B2 | 9/2014 | Stone |
| 8,942,988 | B2 | 1/2015 | Gao |
| 9,293,146 | B2 | 3/2016 | Baumgarte |
| 9,431,019 | B2 | 8/2016 | Kuntz |
| 9,502,040 | B2 | 11/2016 | Kuntz |
| 9,620,129 | B2 | 4/2017 | Helmrich |
| 9,626,974 | B2 | 4/2017 | Thiergart |
| 2012/0224703 | A1* | 9/2012 | Kishi ............... G10L 19/025 381/23 |
| 2013/0218579 | A1* | 8/2013 | Villemoes ......... G10L 19/022 704/503 |
| 2014/0257824 | A1 | 9/2014 | Taleb |
| 2016/0005405 | A1 | 1/2016 | Yen |
| 2016/0210974 | A1 | 7/2016 | Disch |
| 2017/0133023 | A1 | 5/2017 | Disch |

FOREIGN PATENT DOCUMENTS

| | | |
|---|---|---|
| EP | 3176780 | 6/2017 |
| WO | 2015060696 | 4/2015 |
| WO | 2017080835 | 5/2017 |

OTHER PUBLICATIONS

J. D. Jonston, "Estimation of Perceptual Entropy Using Noise Masking Criteria," ICASSP, 1989. (Year: 1989).*
Adami, et al., "Transient-To-Noise Ratio Restoration of Coded Applause-Like Signals," 2017 IEEE Workshop on Applications of Signal Processing to Audio and Acoustics. (Year: 2017).*
Kuntz, "The Transient Steering Decorrelator Tool in the Upcoming MPEG Unified Speech and Audio Coding Standard," AES Convention, 2011. (Year: 2011).*
3rd Generation Partnership Project: Technical Specification Group Services and System Aspects; General Audio Codec Audio Processing Functions: Enhanced AAC Plus General Audio Codec: Encoder specification, AAC part (release 6), vol. 26, Sep. 1, 2004.
Herre, J. et al "Continuously Signal-Adaptive Filterbank for High-Quality Perceptual Audio Coding" Applications of Signal Processing to Audio and Acoustics, Oct. 19-22, 1997, pp. 1-4.
Hurley, N. et al "Comparing Measure of Sparsity", IEEE Transactions on Information Theory, IEEE Transactions on Information Theory, vol. 55, Issue 10, Oct. 2009.
Johnston, J.D et al "Estimation of Perceptual Entropy Using Noise Masking Criteria" IEEE International Conference on Acoustics, Speech, and Signal Processing, Apr. 11-14, 1988.
Manoj, C. et al "Novel Approach for Detecting Applause in Continuous Meeting Speech" 3rd International Conference on Electronics Compute Technology, Apr. 8-10, 2011, pp. 182-186.
Neuendorf, M. et al "The ISO/MPEG Unified Speech and Audio Coding Standard—Consistent High Quality for all Content Types and at all Bit Rates" J. Audio Eng. Soc. vol. 61, No. 21, Dec. 2013, pp. 956-977.
Princen, J. et al "Audio Coding with Signal Adaptive Filterbanks" International Conference on Acoustics, Speech, and Signal Processing, May 9-12, 1995, vol. 5, pp. 3071-3074.
Ghido Florin et al.: "Coding of fine granular audio signals using High Resolution Envelope Processing (HREP)", 2017 IEEE International Conference on Acoustics, Speech and Signal Processing (ICASSP), IEEE, Mar. 5, 2017 (Mar. 5, 2017), pp. 701-705, XP033258508.

* cited by examiner

Fig. 12A
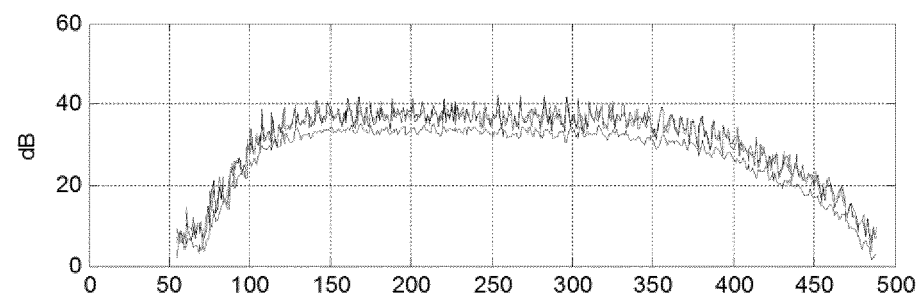
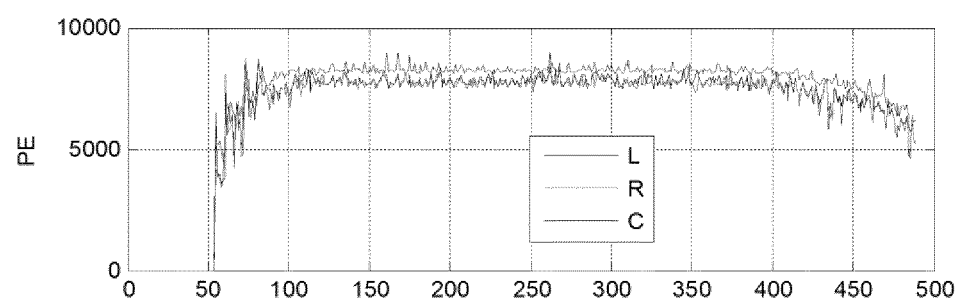
Fig. 12B

Fig. 13A
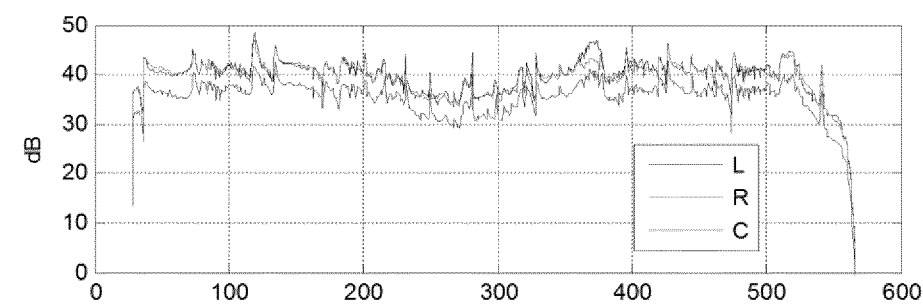
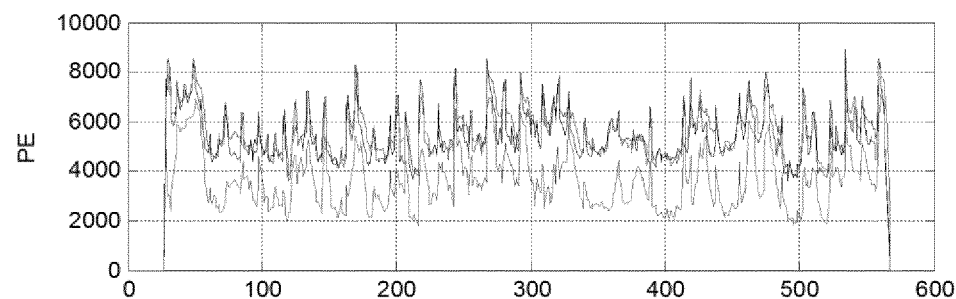
Fig. 13B

LOW COMPLEXITY DENSE TRANSIENT EVENTS DETECTION AND CODING

CROSS-REFERENCE TO RELATED APPLICATIONS

This application claims priority of the following priority applications: US provisional application 62/528,198, filed 3 Jul. 2017 and EP application 17179316.9, filed 3 Jul. 2017, which are hereby incorporated by reference.

TECHNICAL FIELD

The present disclosure relates to methods of encoding audio signals. The present disclosure further relates to methods of detecting dense transient events in portions of audio signals. The present disclosure also relates to corresponding apparatus, such as encoders, for example.

BACKGROUND

Perceptual or lossy audio codecs (such as MP3, MC, HE-MC, AC-4, for example) are known to have problems with compressing audio signals including dense transient events, such as applause, crackling fire, or rain, for example, without loss of perceived audio quality. Conventional efforts to increase compression efficiency typically tend to lead to vastly increased computational complexity at the encoder-side and/or to a loss of perceived audio quality.

The present disclosure addresses the above issues related to audio coding of audio signals including dense transient events, such as applause, crackling fire, or rain, for example, and describes methods and apparatus for improved coding of such audio signals. The present disclosure further deals with detecting dense transient events in audio signals to enable appropriate treatment thereof.

SUMMARY

According to an aspect of the disclosure, a method of encoding a portion (e.g., frame) of an audio signal is described. The method may include obtaining (e.g., determining, calculating, or computing) a value of a first feature relating to a perceptual entropy (PE) of the portion of the audio signal. PE is known in the field of audio coding as a measure of perceptually relevant information contained in a particular audio signal and to represent a theoretical limit on the compressibility of the particular audio signal. The method may further include selecting a quantization mode for quantizing the portion of the audio signal (e.g., for quantizing frequency coefficients of the portion of the audio signal, such as MDCT coefficients, for example) based on the (obtained) value of the first feature. The method may further include quantizing the portion of the audio signal using the selected quantization mode. Selecting the quantization mode may involve determining, based at least in part on the (obtained) value of the first feature, whether a quantization mode that applies (e.g., enforces) a (substantially) constant signal-to-noise ratio (SNR) over frequency (e.g., over frequency bands) shall be used for the portion of the audio signal. This quantization mode may be referred to as constant SNR mode or constant SNR quantization mode. Applying the constant SNR over frequency may involve (e.g., relate to) noise shaping (e.g., quantization noise shaping). This may in turn involve appropriate selection or modification of quantization parameters (e.g., quantization step sizes, masking thresholds). Quantization may be performed on a band-by-band basis. Further, quantization may be performed in accordance with a perceptual model (e.g., psychoacoustic model). In such case, for example, scalefactors for scalefactor bands and/or masking thresholds may be selected or modified in order to attain the substantially constant SNR over frequency when performing the quantization.

By enforcing constant SNR over frequency in quantization, audio signals containing dense transient events (e.g., applause, crackling fire, rain, etc.) can be encoded in a manner that achieves improved perceived quality of the audio after decoding. Since this constant SNR quantization mode is rather unusual for encoding audio signals and may not be suitable for other types of audio signals, presence of dense transient events in the audio signal is first detected by referring to perceptual entropy of the audio signal, and the quantization mode is chosen in accordance with the result of the detection. Thereby, degrading of audio signals that do not contain or that do not only contain dense transient events (such as music, speech, applause mixed with music and/or cheering, for example) can be reliably avoided. Since the perceptual entropy is determined anyway in state-of-the-art audio codecs (such as MP3, MC, HE-MC, AC-4, for example) for purposes of quantization, performing the aforementioned detection does not significantly add to computational complexity, delay, and memory footprint. On the overall, the proposed method improves the perceived quality of audio after decoding without significantly adding to complexity and memory footprint at the encoder-side.

In embodiments, the method may further include smoothing the value of the first feature over time to obtain a time-smoothed value of the first feature. Then, said determining may be based on the time-smoothed value of the first feature.

Thereby, unnecessary toggling of the decision which quantization mode to use, where toggling might result in audible artifacts, can be avoided. Accordingly, perceptual quality of the audio output can be further improved.

In embodiments, said determining may involve comparing the value of the first feature to a predetermined threshold for the value of the first feature. Said quantization mode that applies (e.g., enforces) the substantially constant signal-to-noise ratio over frequency may be conditionally selected in accordance with a result of the comparison. For example, the quantization mode that applies (e.g., enforces) the substantially constant signal-to-noise ratio over frequency may be selected if (e.g., only if) the value of the first feature is above the predetermined threshold for the value of the first feature.

As has been found, perceptual entropy above a certain threshold may be indicative of dense transient events in the audio signal. Thus, a comparison of the value of the first feature to a threshold offers a simple and reliable determination of whether or not the portion of the audio signal is suitable for quantization using the constant SNR quantization mode.

In embodiments, said determining may be (further) based on a variation over time of the value of the first feature. For example, said determining may be based on a temporal variation, such as a standard deviation over time, or a maximum deviation from a mean value over time. For example, said determining may involve comparing the variation over time of the value of the first feature to a predetermined threshold for the variation. Said quantization mode that applies (e.g., enforces) the substantially constant signal-to-noise ratio over frequency may be conditionally selected in accordance with a result of the comparison. For example, the quantization mode that applies (e.g., enforces)

the substantially constant signal-to-noise ratio over frequency may be selected if (e.g., only if) the variation of the value of the first feature is below the predetermined threshold for the variation. In certain implementations, the quantization mode that applies (e.g., enforces) the substantially constant signal-to-noise ratio over frequency may be conditionally selected in accordance with a result of the comparison for the value of the first feature and the comparison for the variation of the variation of the first feature over time. For example, the quantization mode that applies (e.g., enforces) the substantially constant signal-to-noise ratio over frequency may be selected if (e.g., only if) both the value of the first feature is above its respective threshold and the variation of the first feature over time is below its respective threshold.

As has been found, a perceptual entropy that is high on average but has comparatively little temporal variation may be indicative of dense transient events in the audio signal. Thus, a comparison of the variation over time of the value of the first feature to a threshold offers a simple and reliable determination of whether or not the portion of the audio signal is suitable for quantization using the constant SNR quantization mode. Combining both decision criteria pertaining to the value of the first feature may result in an even more reliable determination of whether the constant SNR quantization mode shall be applied.

In embodiments, the first feature may be proportional to the perceptual entropy. Alternatively, the first feature may be proportional to a factor (component) of the perceptual entropy. The value of the first feature may be obtained in the frequency domain (e.g., MDCT domain).

Since state-of-the-art codes calculate the perceptual entropy anyway, referring to the perceptual entropy as the first feature allows to re-use calculation results, and to thereby avoid a significant increase of complexity and memory footprint for the proposed determination of whether the constant SNR quantization mode shall be applied or not.

In embodiments, the method may further include obtaining a value of a second feature relating to a measure of (spectral) sparsity in the frequency domain (e.g., MDCT domain) of the portion of the audio signal. The measure of sparsity may be given by or relate to the form factor. For example, the measure of sparsity may be proportional to the form factor or the perceptually weighted form factor. Said determining may be (further) based on the value of the second feature.

Referring also to a measure of sparsity allows for an even further improved distinction of cases in which applying the constant SNR quantization mode is advantageous, and cases in which it is not.

In embodiments, the method may further include smoothing the value of the second feature over time to obtain a time-smoothed value of the second feature. Said determining may be based on the time-smoothed value of the second feature.

Thereby, unnecessary toggling of the decision which quantization mode to use, where toggling might result in audible artifacts, can be avoided. Accordingly, perceptual quality of the audio output can be further improved.

In embodiments, said determining may involve comparing the value of the second feature to a predetermined threshold for the value of the second feature. Said quantization mode that applies (e.g., enforces) the substantially constant signal-to-noise ratio over frequency may be conditionally selected in accordance with a result of the comparison. For example, the quantization mode that applies (e.g., enforces) the substantially constant signal-to-noise ratio over frequency may be selected if (e.g., only if) the value of the second feature is above the predetermined threshold for the value of the second feature. Notably, referring to the condition of whether the value of the second feature is above (i.e., exceeds) its threshold in the above determination assumes that the second feature is defined such that its value increases with increasing spectral density (as is the case for the form factor, for example); in the reverse case (i.e., if the second feature is defined such that its value decreases with increasing spectral density), the quantization mode that applies (e.g., enforces) the substantially constant signal-to-noise ratio over frequency would be selected if (e.g., only if) the value of the second feature is below the predetermined threshold for the value of the second feature.

As has been found, a measure of sparsity (such as the form factor, the perceptually weighted form factor, or an estimated number of frequency coefficients (frequency lines) that are not quantized to zero) above a certain threshold may be indicative of dense transient events in the audio signal, and moreover of a case in which applying the constant SNR quantization mode is advantageous. Thus, a comparison of the value of the second feature to a threshold offers a simple and reliable confirmation of the determination of whether or not the portion of the audio signal is suitable for quantization using the constant SNR quantization mode.

Another aspect of the disclosure relates to a method of detecting dense transient events (e.g., applause, crackling fire, rain, etc.) in a portion of an audio signal. The method may include obtaining (e.g., determining, calculating, or computing) a value of a first feature relating to a perceptual entropy of the portion of the audio signal. The method may further include determining whether the portion of the audio signal is likely to contain dense transient events based at least in part on the value of the first feature.

Thereby, the portion of the audio signal can be classified as to its content of dense transient events without significantly adding to computational complexity and memory footprint.

In embodiments, the method may further include generating metadata for the portion of the audio signal. The metadata may be indicative of whether the portion of the audio signal is likely to contain dense transient events.

Providing such metadata enables more efficient and improved post processing of audio signals.

In embodiments, the method may further include smoothing the value of the first feature over time to obtain a time-smoothed value of the first feature. Then, said determining may be based on the time-smoothed value of the first feature.

In embodiments, said determining may involve comparing the value of the first feature to a predetermined threshold for the value of the first feature. Then, it may be determined whether the portion of the audio signal is likely to contain dense transient events in accordance with a result of the comparison. For example, it may be determined that the portion of the audio signal is likely to contain dense transient events if (e.g., only if) the value of the first feature is above the predetermined threshold for the value of the first feature.

In embodiments, said determining may be (further) based on a variation over time of the value of the first feature. For example, said determining may be based on a temporal variation, such as a standard deviation over time, or a maximum deviation from a mean value over time. For example, said determining may involve comparing the variation over time of the value of the first feature to a predetermined threshold for the variation. Then, it may be determined whether the portion of the audio signal is likely to contain dense transient events in accordance with a result of the comparison. For example, it may be determined that the portion of the audio signal is likely to contain dense transient events if (e.g., only if) the variation of the value of the first feature is below the predetermined threshold for the variation. In certain implementations, it may be determined whether the portion of the audio signal is likely to contain dense transient events in accordance with a result of the comparison for the value of the first feature and the comparison for the variation of the variation of the first feature over time. For example, it may be determined that the portion of the audio signal is likely to contain dense transient events if (e.g., only if) both the value of the first feature is above its respective threshold and the variation of the first feature over time is below its respective threshold.

In embodiments, the first feature may be proportional to the perceptual entropy. Alternatively, the first feature may be proportional to a factor (component) of the perceptual entropy. The value of the first feature may be obtained in the frequency domain (e.g., MDCT domain).

In embodiments, the method may further include obtaining a value of a second feature relating to a measure of (spectral) sparsity in the frequency domain (e.g., MDCT domain) of the portion of the audio signal. The measure of sparsity may be given by or relate to the form factor. For example, the measure of sparsity may be proportional to the form factor or the perceptually weighted form factor. Said determining may be (further) based on the value of the second feature.

In embodiments, the method may further include smoothing the value of the second feature over time to obtain a time-smoothed value of the second feature. Said determining may be based on the time-smoothed value of the second feature.

In embodiments, said determining may involve comparing the value of the second feature to a predetermined threshold for the value of the second feature. Then, it may be determined whether the portion of the audio signal is likely to contain dense transient events in accordance with a result of the comparison. For example, it may be determined that the portion of the audio signal is likely to contain dense transient events if (e.g., only if) the value of the second feature is above the predetermined threshold for the value of the second feature. Notably, referring to the condition of whether the value of the second feature is above (i.e., exceeds) its threshold in the above determination assumes that the second feature is defined such that its value increases with increasing spectral density (as is the case for the form factor, for example); in the reverse case (i.e., if the second feature is defined such that its value decreases with increasing spectral density), it would be determined that the portion of the audio signal is likely to contain dense transient events if (e.g., only if) the value of the second feature is below the predetermined threshold for the value of the second feature.

Another aspect of the disclosure relates to a method of encoding a portion of an audio signal. The method may include determining whether the portion of the audio signal is likely to contain dense transient events (e.g., applause, crackling fire, rain, etc.). The method may further include, if (e.g., only if) it is determined that the portion of the audio signal is likely to contain dense transient events, quantizing the portion of the audio signal using a quantization mode that applies (e.g., enforces) a (substantially) constant signal-to-noise ratio over frequency (e.g., over frequency bands) for the portion of the audio signal.

By using this constant SNR quantization mode, audio signals containing dense transient events can be encoded in a manner that achieves improved perceived audio quality of the decoded output audio. On the other hand, conditionally applying the constant SNR quantization mode for portions of the audio signal that are determined to contain dense transient events (i.e., in which dense transient events are detected) allows avoiding degradation of other classes of audio signals (such as music and/or speech, for example).

In embodiments, the method may further include obtaining (e.g., determining, calculating, or computing) a value of a first feature relating to a perceptual entropy of the portion of the audio signal. Then, said determining may be based at least in part on the (obtained) value of the first feature.

In embodiments, the method may further include smoothing the value of the first feature over time to obtain a time-smoothed value of the first feature. Then, said determining may be based on the time-smoothed value of the first feature.

In embodiments, said determining may involve comparing the value of the first feature to a predetermined threshold for the value of the first feature. Then, it may be determined whether the portion of the audio signal is likely to contain dense transient events in accordance with a result of the comparison. For example, it may be determined that the portion of the audio signal is likely to contain dense transient events if (e.g., only if) the value of the first feature is above the predetermined threshold for the value of the first feature.

In embodiments, said determining may be (further) based on a variation over time of the value of the first feature. For example, said determining may be based on a temporal variation, such as a standard deviation over time, or a maximum deviation from a mean value over time. For example, said determining may involve comparing the variation over time of the value of the first feature to a predetermined threshold for the variation. Then, it may be determined whether the portion of the audio signal is likely to contain dense transient events in accordance with a result of the comparison. For example, it may be determined that the portion of the audio signal is likely to contain dense transient events if (e.g., only if) the variation over time of the value of the first feature is below the predetermined threshold for the variation. In certain implementations, it may be determined whether the portion of the audio signal is likely to contain dense transient events in accordance with a result of the comparison for the value of the first feature and the comparison for the variation of the variation of the first feature over time. For example, it may be determined that the portion of the audio signal is likely to contain dense transient events if (e.g., only if) both the value of the first feature is above its respective threshold and the variation of the first feature over time is below its respective threshold.

In embodiments, the first feature may be proportional to the perceptual entropy. Alternatively, the first feature may be proportional to a factor (component) of the perceptual entropy. The value of the first feature may be obtained in the frequency domain (e.g., MDCT domain).

In embodiments, the method may further include obtaining a value of a second feature relating to a measure of (spectral) sparsity in the frequency domain (e.g., MDCT domain) of the portion of the audio signal. The measure of sparsity may be given by or relate to the form factor. For example, the measure of sparsity may be proportional to the form factor or the perceptually weighted form factor. Said determining may be (further) based on the value of the second feature.

In embodiments, the method may further include smoothing the value of the second feature over time to obtain a time-smoothed value of the second feature. Said determining may be based on the time-smoothed value of the second feature.

In embodiments, said determining may involve comparing the value of the second feature to a predetermined threshold for the value of the second feature. Then, it may be determined whether the portion of the audio signal is likely to contain dense transient events in accordance with a result of the comparison. For example, it may be determined that the portion of the audio signal is likely to contain dense transient events if (e.g., only if) the value of the second feature is above the predetermined threshold for the value of the second feature. Notably, referring to the condition of whether the value of the second feature is above (i.e., exceeds) its threshold in the above determination assumes that the second feature is defined such that its value increases with increasing spectral density (as is the case for the form factor, for example); in the reverse case (i.e., if the second feature is defined such that its value decreases with increasing spectral density), it would be determined that the portion of the audio signal is likely to contain dense transient events if (e.g., only if) the value of the second feature is below the predetermined threshold for the value of the second feature.

Another aspect relates to an apparatus (e.g., an encoder for encoding a portion of an audio signal). The apparatus (e.g., encoder) may include a processor. The apparatus may further include a memory coupled to the processor and storing instructions for execution by the processor. The processor may be adapted to perform the method of any one of the aforementioned aspects and embodiments.

Another aspect relates to a software program. The software program may be adapted for execution on a processor and for performing the method steps outlined in the present disclosure when carried out on a computing device.

Another aspect relates to a storage medium. The storage medium may include a software program adapted for execution on a processor and for performing the method steps outlined in the present disclosure when carried out on a computing device.

Yet another aspect relates to a computer program product. The computer program may include executable instructions for performing the method steps outlined in the present disclosure when executed on a computer.

It should be noted that the methods and apparatus including its preferred embodiments as outlined in the present disclosure may be used stand-alone or in combination with the other methods and systems disclosed in this disclosure. Furthermore, all aspects of the methods and apparatus outlined in the present disclosure may be arbitrarily combined. In particular, the features of the claims may be combined with one another in an arbitrary manner.

BRIEF DESCRIPTION OF THE DRAWINGS

Example embodiments of the present disclosure are explained below with reference to the accompanying drawings, wherein:

FIGS. 12A, 12B, 13A, and 13B are graphs illustrating feasibility of methods according to embodiments of the disclosure.

DETAILED DESCRIPTION

Figure 1:
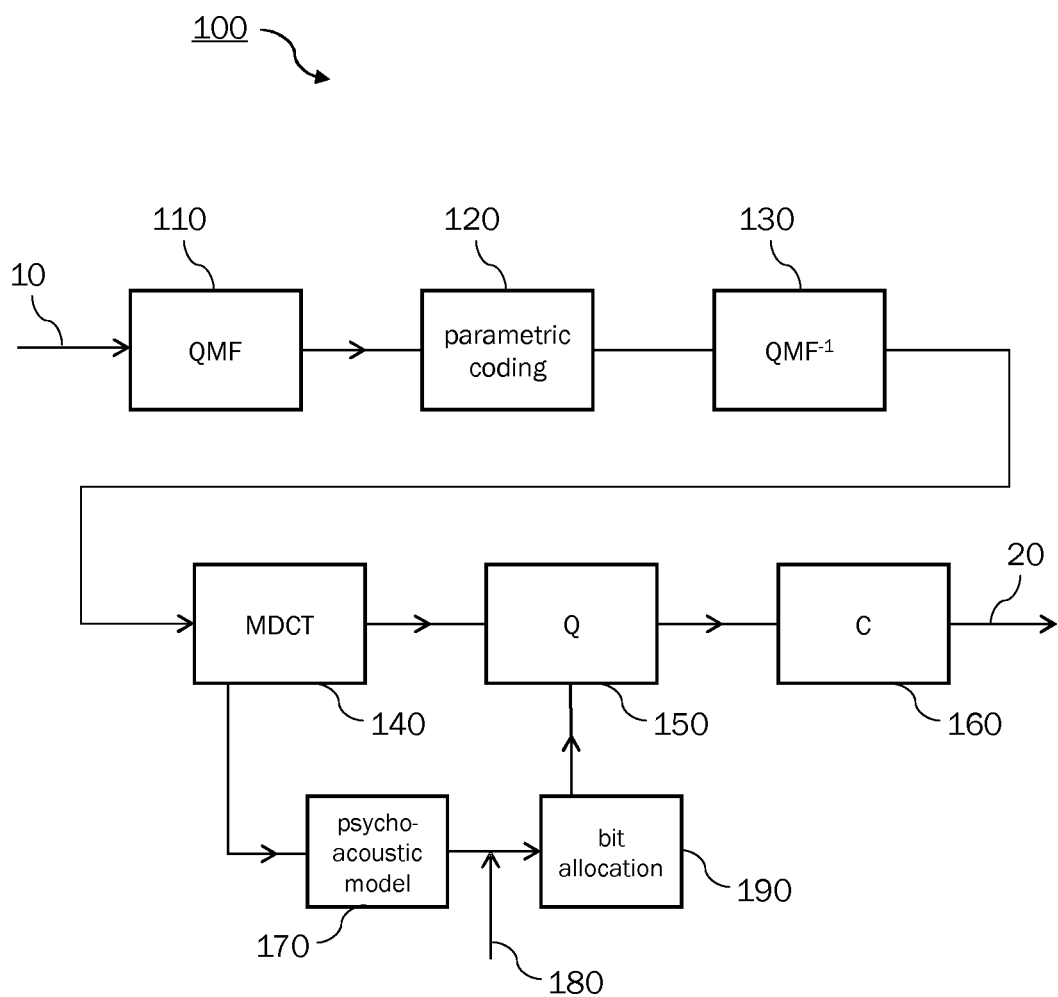
FIG. 1 is a block diagram schematically illustrating an encoder to which embodiments of the disclosure may be applied.

The present disclosure describes two schemes (methods) for addressing the above issues. These schemes, directed to detecting dense transient events and encoding of portions of audio signals comprising dense transient events, respectively, may be employed individually or in conjunction with each other.

Broadly speaking, the present disclosure relates to improving audio quality of dense transient event audio signals (such as applause, crackling fire, rain, etc.), without negatively impacting audio quality of other classes of audio signals. The present disclosure further seeks to achieve this goal at low complexity at the encoder-side, with negligible memory footprint and delay. To this end, the present disclosure describes methods for detecting dense transient events in (portions of) audio signals, using features that are already computed in a perceptual audio encoder. The present disclosure further describes methods for quantizing dense transient event audio signals using a special constant signal-to-noise ratio quantization noise shaping mode to improve the audio quality of these dense transient audio signals. In order to avoid degradation of other classes of audio signals, the present disclosure further proposes to conditionally apply this special constant signal-to-noise ratio quantization noise shaping mode in accordance with a result of the detection of dense transient events in the audio signal. The present disclosure is particularly, though not exclusively, applicable to the AC-4 audio codec.

Throughout this disclosure a portion of an audio signal shall mean a section of certain length (e.g., in the time domain or in the frequency domain) of an audio signal. A portion may relate to a certain number of samples (e.g., Pulse Code Modulation, PCM, samples), to a certain number of frames, may be defined to extend over a certain amount of time (e.g., over a certain number of ms), or may relate to a certain number of frequency coefficients (e.g., MDCT coefficients). For example, the portion of the audio signal may indicate a frame of the audio signal or a sub-frame of the audio signal. Further, the audio signal may include more than one channel (e.g., two channels in a stereo configuration, or 5.1 channels, 7.1 channels, etc.). In this case, the portion of the audio signal shall mean a section of certain length, as described above, of the audio signal in a given one of the channels of the audio signal. Notably, the present disclosure is applicable to any or each of the channels of a multi-channel audio signal. Multiple channels may be processed in parallel or sequentially. Further, the present disclosure may be applied to a sequence of portions, and respective portions may be processed sequentially by the proposed methods and apparatus.

Further, throughout this disclosure dense transient events shall mean a series of individual, brief (measurable) events (e.g., hand claps of applause, fire crackles, splashes of rain) which persist as (e.g., impulsive) noise bursts. Dense transient signals (signals of dense transient events) within the meaning of the present disclosure (and for which the proposed detector for dense transient events would turn ON) shall include 20 to 60 measurable transient events per second, e.g. 30 to 50, or typically 40 measurable events per second. Time intervals between subsequent transient events in dense transient events may vary. Dense transient events are distinct from tonal audio signals (such as music), speech, and sparse transient events (such as castanets, for example). Further, dense transient events may be noisy (i.e., without strong, stable periodic components) and rough (i.e., with an amplitude modulated in the 20-60 Hz range). Dense transient events may also be referred to as sound textures. Examples of dense transient events include applause, crackling fire, rain, running water, babble, and machinery, etc.

Figure 2:
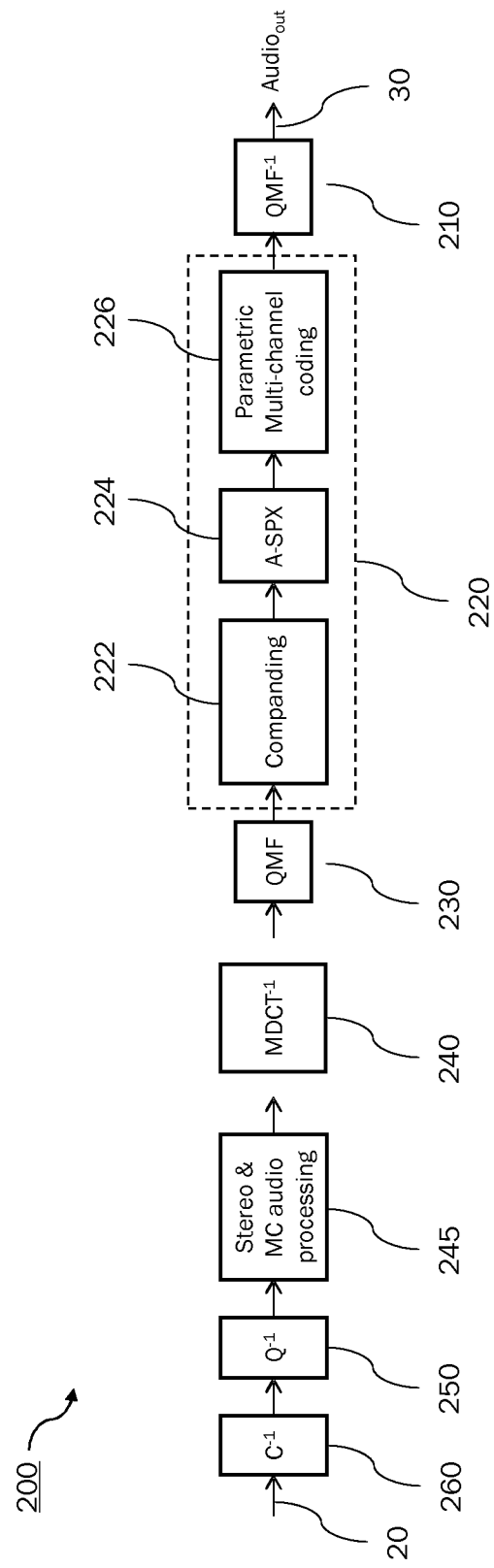
FIG. 2 is a block diagram schematically illustrating a decoder corresponding to the encoder of FIG. 1.

FIG. 1 is a block diagram of an encoder 100 (e.g., AC-4 encoder) to which embodiments of the disclosure may be applied. FIG. 2 is a block diagram of a corresponding decoder 200 (e.g., AC-4 decoder).

The encoder 100 comprises a filterbank analysis block 110, a parametric coding block 120, a filterbank synthesis block 130, a time-frequency transform block 140, a quantization block 150, a coding block 160, a psychoacoustic modeling block 170, and a bit allocation block 190. The parametric coding block 120 may comprise (not shown) parametric bandwidth extension coding tools (A-SPX), parametric multi-channel coding tools, and a companding tool for temporal noise shaping. The time-frequency transform block 140, the quantization block 150, the psychoacoustic modeling block 170, and the bit allocation block 190 may be said to form an audio spectral frontend (ASF) of the encoder 100. The present disclosure may be said to relate to an implementation (modification) of the ASF of the encoder 100. In particular, the present disclosure may be said to relate to modifying the psychoacoustic model in the ACF (e.g., of AC-4) to enforce a different noise shaping guided by an additional detector located in the ASF for detecting dense transient events. However, the present disclosure is not so limited and may be likewise applied to other encoders.

The encoder 100 receives an input audio signal 10 (e.g., samples of an audio signal, such as PCM samples, for example) as an input. The input audio signal 10 may have one or more channels, e.g. may be a stereo signal with a pair of channels, or a 5.1 channel signal. However, the present disclosure shall not be limited to any particular number of channels. The input audio signal 10 (e.g., the samples of the audio signal) is subjected to a filterbank analysis, e.g. a QMF analysis, at the filterbank analysis block 110 to obtain a filterbank representation of the audio signal. Without intended limitation, reference will be made to a QMF filterbank in the remainder of this disclosure. Then, parametric coding, which may involve bandwidth extension and/or channel extension is performed at the parametric coding block 120. After filterbank synthesis (e.g., QMF synthesis) at the filterbank synthesis block 130, the audio signal is provided to the time-frequency transform block 140, at which a time-frequency analysis (e.g., MDCT analysis) is performed. Without intended limitation, reference will be made to a MDCT as an example of a time-frequency transform in the remainder of this disclosure. The MDCT yields a sequence of blocks of frequency coefficients (MDCT coefficients). Each block of frequency coefficients corresponds to a block of samples of the audio signal. The number of samples in each block of samples of the audio signal is given by the transform length that is used by the MDCT.

Then, a psychoacoustic model is applied to the MDCT coefficients at the psychoacoustic modeling block 170. The psychoacoustic model may group the MDCT coefficients into frequency bands (e.g., scalefactor bands), the respective bandwidths of which may depend on a sensitivity of the human auditory sensitivity at the frequency bands' center frequency. A masking threshold 180 (e.g., psychoacoustic threshold) is applied to the MDCT coefficients after psychoacoustic modeling, and a bit allocation for each frequency band is determined at the bit allocation block 190. The number of allocated bits for a frequency band may translate into a quantization step size (e.g., scalefactor). Then, the (masked) MDCT coefficients in each frequency band are quantized at the quantization block 150 in accordance with the determined bit allocation for the respective frequency band, i.e., the MDCT coefficients are quantized in accordance with the psychoacoustic model. The quantized MDCT coefficients are then encoded at the coding block 160. Eventually the encoder 100 outputs a bitstream (e.g., AC-4 bitstream) 20 that can be used for storing or for transmission to a decoder. Notably, the above-described operations at each block may be performed for each of the channels of the audio signal.

The corresponding decoder 200 (e.g., AC-4 decoder) is shown in FIG. 2 and comprises an inverse coding block 260, an inverse quantization block 250, a stereo and multi-channel (MC) audio processing block 245, an inverse time-frequency transform block 240, a filterbank analysis block 230, an inverse parametric coding block 220, and a filterbank synthesis block 210. The inverse parametric coding block 220 comprises a companding block 222, an A-SPX block 224, and a parametric multi-channel coding block 226. The decoder 200 receives an input bitstream (e.g., AC-4 bitstream) 20 and outputs an output audio signal (e.g., PCM samples) 30 for one or more channels. The blocks of the decoder 200 reverse respective operations of the blocks of the encoder 100.

Notably, any of the methods described below may also comprise applying a time-frequency transform to the portion of the audio signal. In the example of the AC-4 audio codec, an MDCT is applied to the (portion of the) audio signal. The time-frequency transform (e.g. MDCT) may be applied to the (samples of the) (portion of the) audio signal in accordance with a (pre-)selected transform length (e.g., using an analysis window determined by the transform length; for the case of MDCT, the analysis window is determined by the transform length of the previous, the current and the next MDCT). As an output, this yields a sequence of blocks of frequency coefficients (e.g., MDCT coefficients). Each block of frequency coefficients in said sequence corresponds to a respective block of samples, wherein the number of samples in each block of samples is given by the transform length. Further, the blocks of samples corresponding to the sequence of blocks of frequency coefficients may correspond to a frame or a half-frame, depending on the relevant audio codec. Further, in any of the methods described below, a psychoacoustic model may be calculated for frequency bands (e.g., for the so called scalefactor bands, which groups of frequency sub-bands, e.g., groups of MDCT lines). According to the psychoacoustic model, all frequency coefficients (e.g., MDCT coefficients) of a frequency band (e.g., scalefactor band) may be quantized with the same scalefactor, wherein the scalefactor determines the quantizer step size (quantization step size). Before actual quantization, a masking threshold may be applied to the frequency bands to determine how the frequency coefficients in a given frequency band shall be quantized. For example, the masking threshold may determine, possibly together with other factors, the quantization step size for quantization. At least part of the methods described below relate to selecting or modifying quantization parameters (e.g., masking thresholds and scalefactors) for quantization. If certain conditions are met, the quantization parameters may be selected or modified such that a specific noise shaping scheme is applied (e.g., so that a constant SNR over frequency is enforced).

Figure 3:
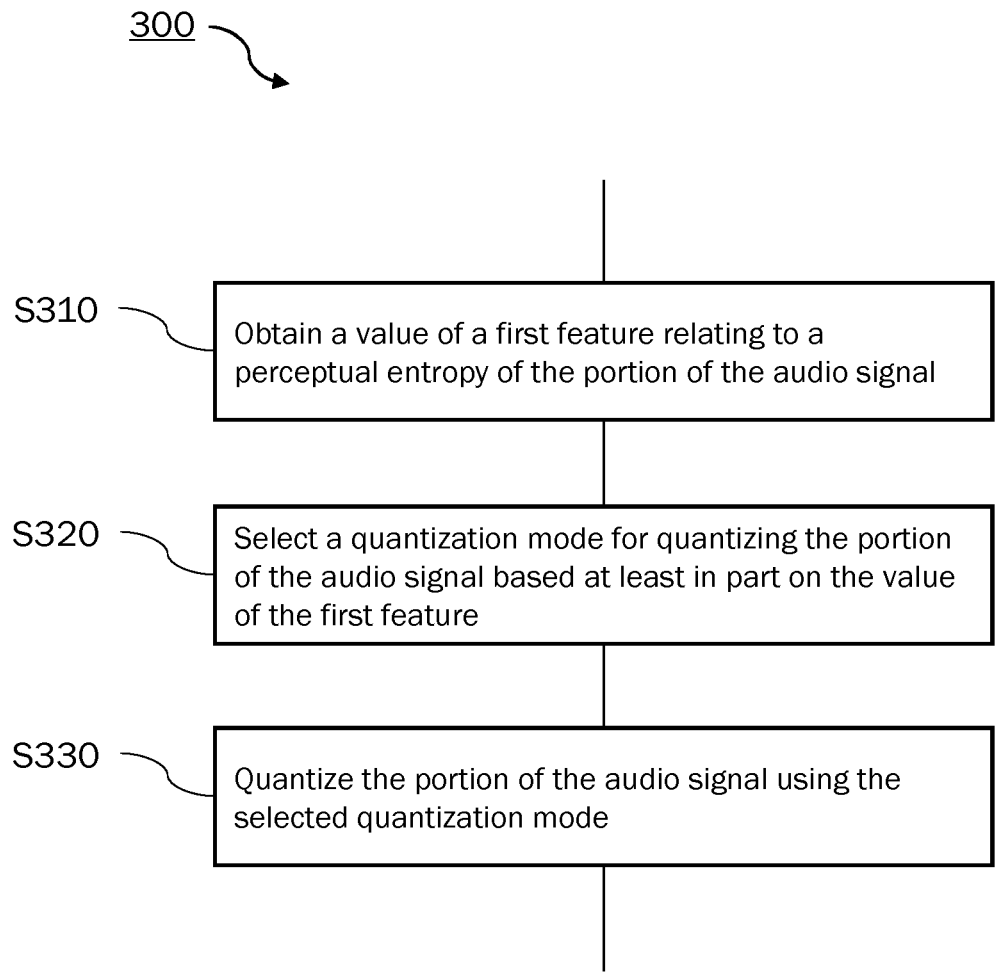
FIG. 3 is a flow chart illustrating an example of a method of encoding a portion of an audio signal according to embodiments of the disclosure.

FIG. 3 is a flow chart illustrating an example of a method 300 of encoding a portion (e.g., frame) of an audio signal according to embodiments of the disclosure. This method may be advantageously applied for encoding portions of an audio signal that contain dense transient events, such as applause, crackling fire, or rain, for example.

At step S310, a value of a first feature relating to a perceptual entropy of the portion of the audio signal is obtained. For example, the value of the first feature may be determined, computed, or calculated, possibly following analysis of the portion of the audio signal. The value of the first feature may be obtained in the frequency domain (e.g., in the MDCT domain). For example, the portion of the audio signal may be analyzed in the frequency domain (e.g., MDCT domain). Alternatively, the value of the first feature may also be obtained in the time domain. For example, speech codecs are typically time-domain codecs based on linear prediction. Linear prediction filter coefficients model the signal spectrum and also the masking model in speech codecs is derived from the linear prediction coefficients, so that features relating to perceptual entropy can be derived also in time-domain codecs.

Approaches for determining measures of perceptual entropy are described in James D. Johnston, Estimation of perceptual entropy using noise masking criteria, ICASSP, 1988, which is hereby incorporated by reference in its entirety. Any of the approaches described therein may be used for the present purpose. However, the present disclosure shall not be limited to these approaches, and also other approaches are feasible.

The first feature may be given by or may be proportional to the perceptual entropy of the given portion of the audio signal.

In general, the perceptual entropy is a measure of the amount of perceptually relevant information contained in a (portion of a) given audio signal. It represents a theoretical limit on the compressibility of the given audio signal (provided that a perceivable loss in audio quality is to be avoided). As will be detailed below, the perceptual entropy may be determined for each frequency band in an MDCT representation of the portion of the audio signal and may be generally said to depend, for a given frequency band (e.g., scalefactor band) on a ratio between the energy spectrum (energy) of the given frequency band and a psychoacoustic threshold in an applicable psychoacoustic model for the given frequency band.

In more detail, the value of the first feature may be calculated in a psychoacoustic model, for example in the manner described in document 3GPP TS 26.403 (V1.0.0), section 5.6.1.1.3, which section is hereby incorporated by reference in its entirety. In this psychoacoustic model, the perceptual entropy is determined as follows.

First, the perceptual entropy is determined for each scalefactor band (as an example of a frequency band) via $$sfbPe = nl \cdot \begin{cases} \log_2\left(\frac{en}{thr}\right) & \text{for } \log_2\frac{en}{thr} \geq c1 \\ \left(c2 + c3 \cdot \log_2\left(\frac{en}{thr}\right)\right) & \text{for } \log_2\frac{en}{thr} < c1 \end{cases}$$

with $c1=\log_2(8)$, $c2=\log_2(2.5)$, $c3=1-c2/c1$. The energy spectrum (or energy) en for the n-th scalefactor band is given by $$en(n) = \sum_{k=kOffset(n)}^{kOffset(n+1)-1} X(k) \cdot X(k)$$

where n denotes the index of the respective scalefactor band, X(k) is the value of the frequency coefficient (e.g., MDCT line) for index k, and kOffset(n) is the index of the lowest-frequency (i.e., first) MDCT line of the n-th scalefactor band. The number n1 denotes the estimate of the number of lines in the scalefactor band that will not be zero after quantization. This number can be derived from the form factor ffac(n) via $$nl = \frac{ffac(n)}{\left(\frac{en(n)}{kOffset(n+1)-kOffset(n)}\right)^{0.25}}$$

The form factor ffac(n) is defined as $$ffac(n) = \sum_{k=kOffset(n)}^{kOffset(n+1)-1} \sqrt{|X(k)|}$$

In the above, thr(n) denotes the psychoacoustic threshold for the n-th scalefactor band. One way to determine the psychoacoustic threshold thr is described in section 5.4.2 of document 3GPP TS 26.403 (V1.0.0), which section is hereby incorporated by reference in its entirety.

The total perceptual entropy of a given portion (e.g., frame) of the audio signal is the sum of the scalefactor band perceptual entropies, $$pe = peOffset + \sum_n sfbPe(n)$$

where peOffset is a constant value (that may be zero in some implementations) that can be added to achieve a more linear relationship between perceptual entropy and the number of bits needed for encoding the portion (e.g., frame) of the audio signal.

It is understood that the above expression for the perceptual entropy can be split into several components (e.g., terms and/or factors). It is considered that a combination of any, some, or all of these components may be used instead of the full expression for the perceptual entropy for obtaining the value of the first feature.

In general, the perceptual entropy of a given frequency band (e.g., scalefactor band) in the context of this disclosure can be said to depend on a ratio between the energy spectrum (energy) en of the given frequency band and the psychoacoustic threshold thr for the given frequency band. Accordingly, the first feature may be said to depend on the ratio between the energy spectrum (energy) en of the given frequency band and the psychoacoustic threshold thr for the given frequency band.

At step S320, a quantization mode for quantizing the portion of the audio signal is selected based on the value of the first feature. In general, the quantization mode may be said to be selected based on the first feature. This may involve a determination of, based at least in part on the value of the first feature, whether a quantization mode that applies (e.g., enforces) a substantially constant signal-to-noise ratio over frequency (e.g., for all frequency bands) shall be used for the portion of the audio signal (e.g., for the frequency coefficients, such as MDCT coefficients, for example, of a frequency domain representation of the portion of the audio signal). This quantization mode may be referred to as constant SNR mode, constant SNR quantization mode, or constant SNR quantization noise shaping mode. Applying the constant SNR quantization mode may be referred to as applying a dense transient event improvement (e.g., applause improvement), or simply, as applying an improvement, to the portion of the audio signal. Without intended limitation, applying this improvement may also be referred to as applying a fix in the remainder of this disclosure, without this term implying that the improvement is only of temporal nature.

Notably, applying the constant SNR quantization mode is a rather unusual choice for encoding an audio signal. As has been found, the constant SNR quantization mode is suitable for quantizing portions of dense transient events and may produce a pleasant auditory result for such audio signals. However, given the circumstances applying the constant SNR quantization mode may degrade other audio signals, such as music and speech, or combinations of dense transient events with music or speech, which typically require non-constant SNR for best perceptual quality. This issue is addressed by the selection process for the quantization mode at step S320.

Selection of the quantization mode at step S320 may be said to correspond to modifying the psychoacoustic model that is used for quantizing the audio signal (e.g., modifying the frequency coefficients, or MDCT coefficients) to apply (e.g., enforce) a different noise shaping in the quantization process.

Optionally at this step, the obtained value of the first feature may be smoothed over time, in order to avoid unnecessary toggling of the selection at step S320. In particular, frame-to-frame switching of the selection can be avoided by considering a time-smoothed version of the value of the first feature. In this case, the selection (e.g., the determination) would be based, at least in part, on the time-smoothed value of the first feature.

Figure 8:
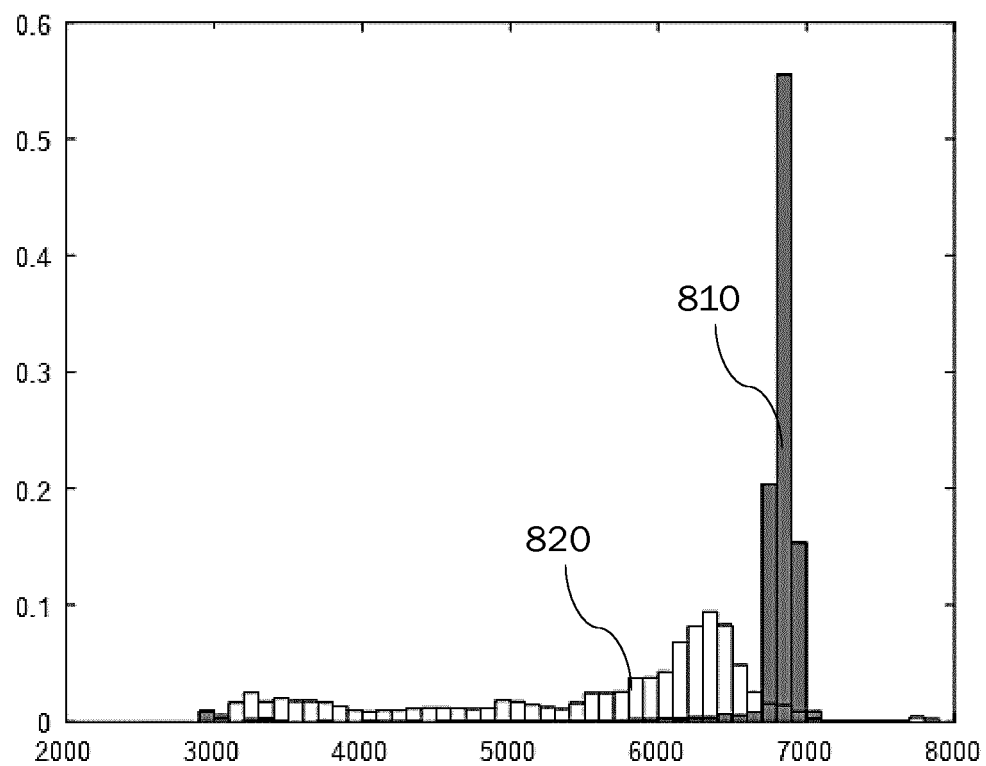
FIGS. 8, 9, 10, and 11 are histograms illustrating feasibility of methods according to embodiments of the disclosure.

As has been found, the perceptual entropy is a suitable feature for discriminating portions of an audio signal that contain dense transient events (e.g., applause, crackling fire, rain, etc.) from portions that contain speech or music. This is illustrated in the histogram of FIG. 8. This histogram, as well as the remaining histograms that are discussed in this disclosure, is normalized so that bar heights add to one and uniform bin width is used. In this histogram, the horizontal axis indicates a (time-smoothed) measure of perceptual entropy, and the vertical axis indicates a (normalized) count of items per bin of the measure of perceptual entropy. For this histogram, as well as for the remaining histograms concerning perceptual entropy in this disclosure, the estimated total number of bits per (encoded) AC-4 frame is used as the measure of perceptual entropy. However, methods according to this disclosure are not limited to considering such measure of perceptual entropy, and other measures of perceptual entropy are feasible as well. Bin counts 810 (dark grey) in the histogram relate to a set of audio items that have been manually classified as applause items (in particular, applause items that are improved by the fix), whereas bin counts 820 (white) relate to a set of audio items that have been manually classified as non-applause items (e.g., speech or music). As can be seen from the histogram, the perceptual entropy is consistently higher for the applause items than for the non-applause items, so that the perceptual entropy can provide for suitable discrimination between the two classes of audio items.

Figure 9:
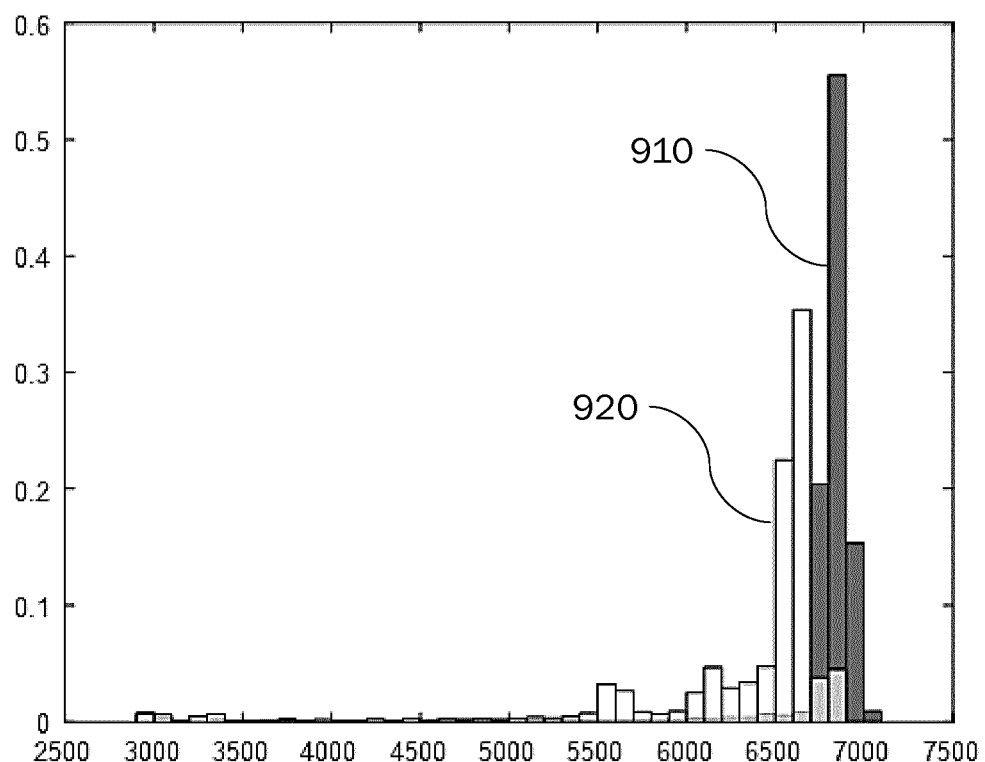

Further, the perceptual entropy is also a suitable feature for discriminating portions of an audio signal that contain dense transient events and are improved by the fix, and portions of an audio signal that contain dense transient events but that may not be improved by the fix (e.g., portions that contain dense transient evens, but that also contain speech and/or music). This is illustrated in the histogram of FIG. 9, in which the horizontal axis indicates a (time-smoothed) measure of perceptual entropy, and the vertical axis indicates a (normalized) count of items per bin of the measure of perceptual entropy. Bin counts 910 (dark grey) in the histogram relate to a set of audio items that have been manually classified as applause items that are improved by the fix, whereas bin counts 920 (white) relate to a set of audio items that have been manually classified as applause items that are not improved by the fix. As can be seen from the histogram, the perceptual entropy is consistently higher for the applause items that are improved by the fix than for applause items that are not improved by the fix, so that the perceptual entropy can provide for suitable discrimination between the two classes of audio items. In other words, the (time-smoothed) perceptual entropy can also be used to sub-classify audio items relating to dense transient events (such as applause, crackling fire, rain, etc.).

Accordingly, the determination of whether a quantization mode that applies (e.g., enforces) a substantially constant signal-to-noise ratio over frequency shall be used for the portion of the audio signal may involve comparing the value of the first feature (or, if available, the time-smoothed value of the first feature) to a predetermined threshold for the value of the first feature. This threshold may be determined manually, for example, to have a value that ensures reliable classification of audio items into applause items (or applause items that are improved by the fix) and non-applause items. The quantization mode that applies (e.g., enforces) a substantially constant signal-to-noise ratio over frequency may be conditionally selected in accordance with (e.g., depending on) a result of this comparison. For example, the quantization mode that applies (e.g., enforces) a substantially constant signal-to-noise ratio over frequency may be selected if (e.g., only if) the value of the first feature (or the time-smoothed value of the first feature) is above the predetermined threshold for the first feature. Notably, reference to applause, as an example of an audio item containing dense transient events is made without intended limitation, and the present disclosure shall not be construed to be in any way limited by this reference.

Alternatively or additionally, the determination may be based on a variation over time of the value of the first feature (notably, the variation over time would be determined from the un-smoothed version of the value of the first feature).

This variation over time may be the standard deviation over time or a maximum deviation from the mean over time, for example. In general, the time variation may indicate a temporal variation or temporal peakedness of the value of the first feature.

As has been found, also the time variation of the perceptual entropy is suitable for discriminating portions of an audio signal that contain dense transient events (e.g., applause, crackling fire, rain, etc.) from portions that contain speech and/or music. This is illustrated in the graphs of FIGS. 12A and 12B and FIGS. 13A and 13B.

FIG. 12A illustrates the broad band energy (in dB) for different channels of an applause audio signal (as an example of an audio signal of dense transient events) as a function of time, FIG. 12B illustrates the perceptual entropy for the different channels of the applause audio signal as a function of time, FIG. 13A illustrates the broad band energy (in dB) for different channels of a music audio signal as a function of time, and FIG. 13B illustrates the perceptual entropy for the different channels of the music audio signal as a function of time. As can be seen from these graphs, dense transient event signals (e.g., applause signals) have consistently very low standard deviation (with respect to time) of the perceptual entropy at a high average perceptual entropy, whereas non-dense transient event signals may have high bursts of perceptual entropy, but at lower average perceptual entropy. Therefore, any features derived from perceptual entropy that indicate temporal variation or temporal peakedness of perceptual entropy may also be used to detect dense transient events and to discriminate dense transient events from, for example, music and/or speech.

Accordingly, the determination of whether the quantization mode that applies (e.g., enforces) a substantially constant signal-to-noise ratio over frequency shall be used for the portion of the audio signal may involve comparing the variation over time of the value of the first feature to a predetermined threshold for the variation over time of the value of the first feature. Also this threshold may be determined manually, for example, in line with the criteria set out above for the threshold for the value of the first feature. Then, the decision of whether or not to select the quantization mode that applies (e.g., enforces) a substantially constant signal-to-noise ratio over frequency may be made in accordance with (e.g., depending on) a result of this comparison. For example, the quantization mode that applies (e.g., enforces) a substantially constant signal-to-noise ratio over frequency may be selected if (e.g., only if) the variation over time of the value of the first feature is below the predetermined threshold for the variation over time of the value of the first feature.

As indicated above, either or both of the (time-smoothed) value of the first feature and the variation over time of the value of the first feature may be referred to for determining whether to use the constant SNR quantization mode. If both are referred to, the decision of whether or not to select the quantization mode that applies (e.g., enforces) a substantially constant signal-to-noise ratio over frequency may be made in accordance with (e.g., depending on) the results of both the aforementioned comparisons to respective thresholds. For example, the quantization mode that applies (e.g., enforces) a substantially constant signal-to-noise ratio over frequency shall be used for the portion of the audio signal may be selected if (e.g., only if), the (time-smoothed) value of the first feature is above the predetermined threshold for the value of the first feature and the time variation of the value of the first feature is below the predetermined threshold for the variation over time of the value of the first feature.

On the other hand, if the aforementioned criteria of the determination are not met, a quantization mode that does not apply a substantially constant SNR over frequency (i.e., that applies different SNRs to different frequencies or frequency bands) may be selected at this point. In other words, the constant SNR quantization mode is conditionally applied depending on whether the aforementioned criteria of the determination are met.

At step S330, the portion of the audio signal is quantized using the selected quantization mode. More specifically, frequency coefficients (e.g., MDCT coefficients) of the portion of the audio signal may be quantized at this step. Quantization may be performed in accordance with the psychoacoustic model. Further, quantization may involve noise shaping (i.e., shaping of quantization noise). If the selected quantization mode is the quantization mode that applies (e.g., enforces) a (substantially) constant SNR over frequency (e.g., over frequency bands), this may involve selecting appropriate quantization parameters, such as masking thresholds and/or quantization step sizes (e.g., scalefactors) or appropriately modifying the quantization parameters, to achieve the substantially SNR over frequency (e.g., over frequency bands, such as scalefactor bands).

Notably, the perceptual entropy of (a portion of) an audio signal is computed during normal encoding operation of state-of-the-art audio encoders, such as AC-4, for example. Thus, relying on the perceptual entropy for purposes of selecting a quantization mode does not significantly add to complexity, delay, and memory footprint of the encoding process.

Figure 4:
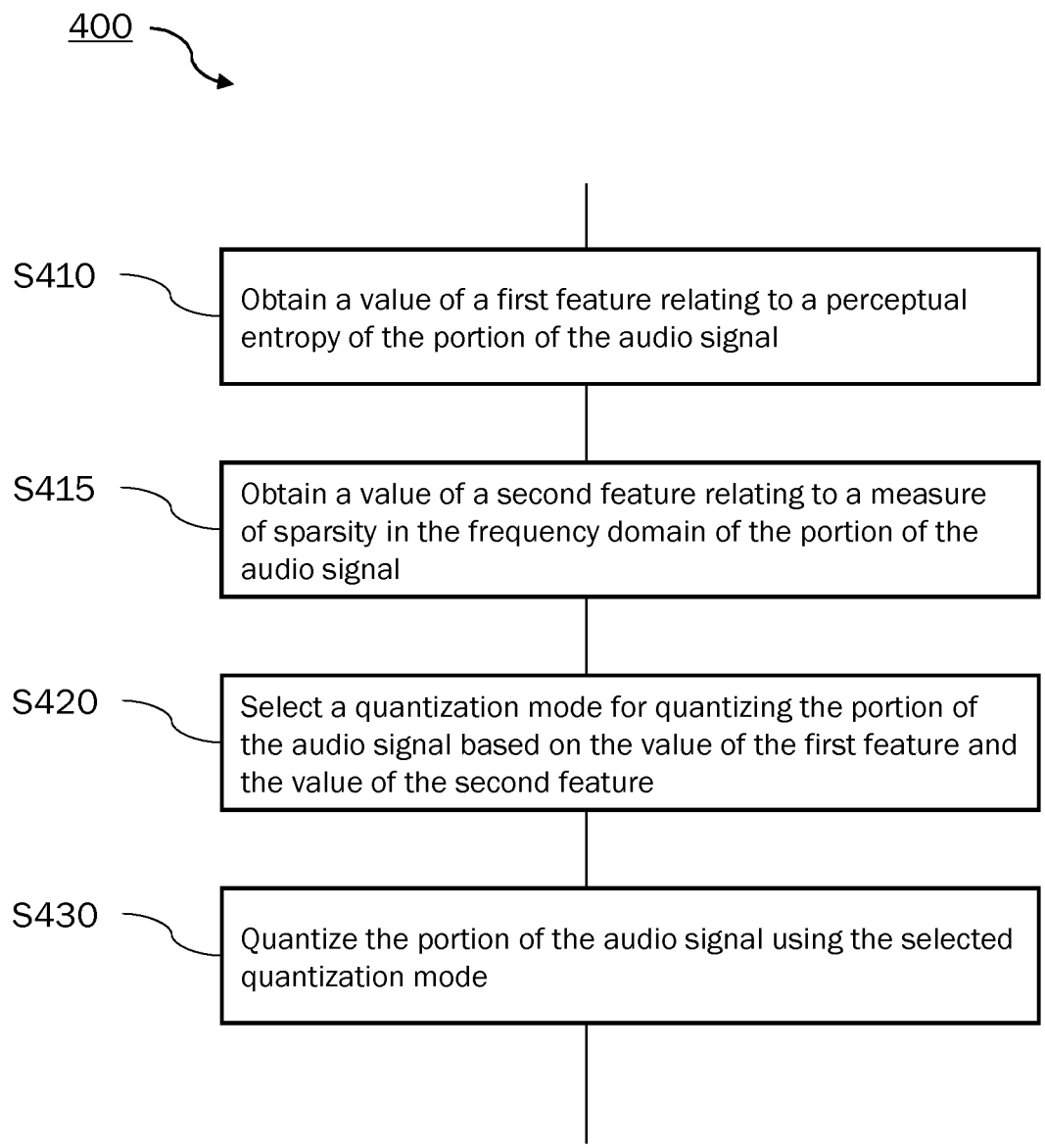
FIG. 4 is a flow chart illustrating an example of a variation of the method of FIG. 3.

FIG. 4 is a flow chart illustrating an example of a variation 400 of the method 300 of FIG. 3.

Step S410 in variation 400 corresponds to step S310 of method 300 in FIG. 3 and any statements made above with respect to this step apply also here.

At step S415, a value of a second feature relating to a measure of sparsity (e.g., spectral sparsity) in the frequency domain of the portion of the audio signal is obtained. For example, the value of the second feature may be determined, computed, or calculated, possibly following analysis of the portion of the audio signal. The value of the second feature may be obtained in the frequency domain (e.g., in the MDCT domain). For example, the portion of the audio signal may be analyzed in the frequency domain (e.g., MDCT domain). Alternatively, the value of the second feature may also be obtained in the time domain. Several measures of sparsity are described in Niall P. Hurley and Scott T. Rickard, Comparing Measures of Sparsity, http://ieeexplore.ieee.org/xpl/RecentIssue.jsp?punumber=18, vol. 55, issue 10, 2009, which is hereby incorporated by reference in its entirety. Any of the measures of sparsity described therein may be used for the present purpose. However, the present disclosure shall not be limited to these measures of sparsity, and also other measures of sparsity are feasible.

The measure of sparsity may be given by or relate to the form factor. That is, the value of the second feature may be given by or relate to the form factor (in the frequency domain) for the portion of the audio signal. For example, the value of the second feature may be proportional to the form factor or the perceptually weighted form factor. The perceptually weighted form factor may be said to be an estimate of a number of frequency coefficients (e.g., per frequency band) that are (expected to be) not quantized to zero.

In general, the form factor depends on a sum of the square root of the absolute values of the frequency coefficients of a frequency-domain representation of a portion of an audio signal, e.g., for each frequency band. An overall from factor may be obtained by summing the form factors for all frequency bands. A prescription for calculating the form factor in the context of the perceptual model of AC-4 has been given above in the context of the discussion of step S310. Alternatively, a perceptually weighted form factor may be used as the measure of sparsity (e.g., as the second feature). An example for a perceptually weighted form factor is given by the number n1 that has been discussed above in the context of S310. An overall perceptually weighted form factor may be obtained by summing perceptually weighted form factors for all frequency bands. Notably, for the remainder of the disclosure, the second feature is assumed to have a higher value for a spectrally denser representation of the (portion of the) audio signal, and to have a lower value for a spectrally sparser representation of the (portion of the) audio signal.

At step S420, a quantization mode for quantizing the portion of the audio signal is selected based (at least in part) on the value of the first feature and the value of the second feature. In general, the quantization mode may be said to be selected based on the first feature and the second feature. This may involve a determination of, based (at least in part) on the value of the first feature and the value of the second feature, whether the quantization mode that applies (e.g., enforces) a substantially constant signal-to-noise ratio over frequency (e.g., for all frequency bands) shall be used for the portion of the audio signal (e.g., for the frequency coefficients, such as MDCT coefficients, for example, of a frequency domain representation of the portion of the audio signal).

Selection of the quantization mode at step S420 may be said to correspond to modifying the psychoacoustic model that is used for quantizing the audio signal (e.g., modifying the frequency coefficients, or MDCT coefficients) to apply (e.g., enforce) a different noise shaping in the quantization process.

Optionally at this step, the obtained value of the second feature may be smoothed over time, in order to avoid unnecessary toggling of the selection at step S420. In particular, frame-to-frame switching of the selection can be avoided by considering a time-smoothed version of the value of the second feature. In this case, the selection (e.g., the determination) would be based, at least in part, on the (time-smoothed, if available) value of the first feature and the time-smoothed value of the second feature.

Figure 10:
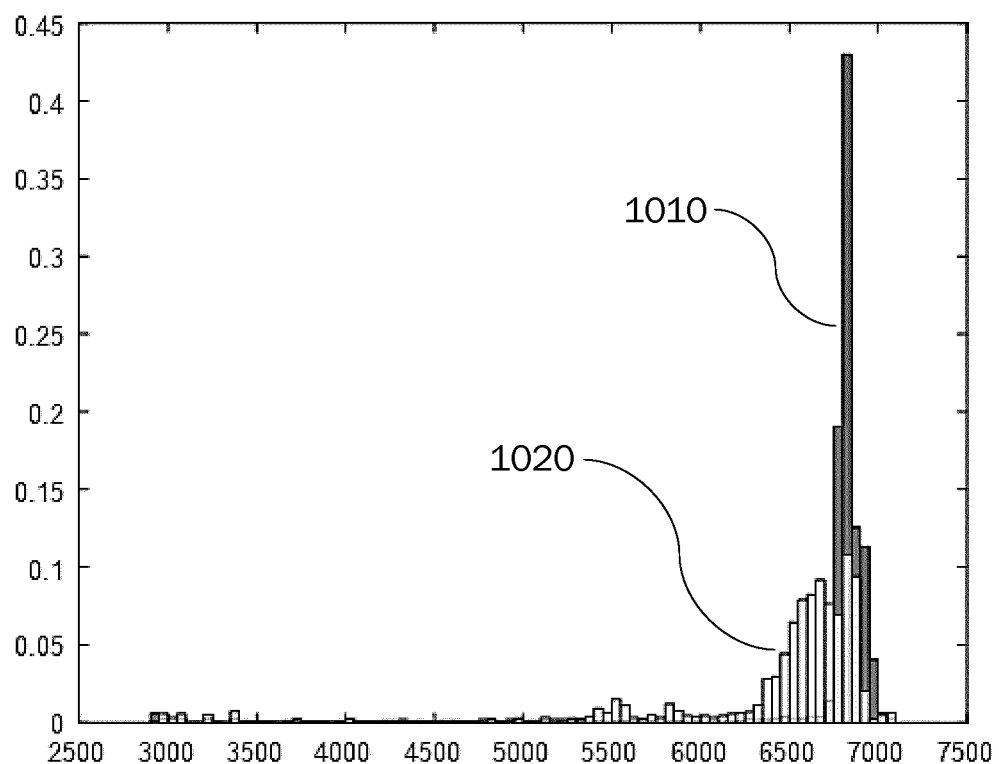

The reason for considering also the value of the second feature is the following. As has been found, the (time-smoothed) perceptual entropy alone may not under all circumstances be sufficient for distinguishing between dense transient event audio items (such as applause items, for example) that are improved by the fix and audio items that contain dense transient events together with speech (including cheering) and/or music (and that may not be improved by the fix). This is illustrated in the histogram of FIG. 10 in which the horizontal axis indicates a (time-smoothed) measure of perceptual entropy, and the vertical axis indicates a (normalized) count of items per bin of the measure of perceptual entropy. Bin counts 1010 (dark grey) in the histogram relate to a set of audio items that have been manually classified as applause items that are improved by the fix, whereas bin counts 1120 (white) relate to a set of audio items that have been manually classified as applause containing speech (including cheering) and/or music. As can be seen from the histogram, distinguishing between these two classes of audio items may be difficult, depending on circumstances.

Figure 11:
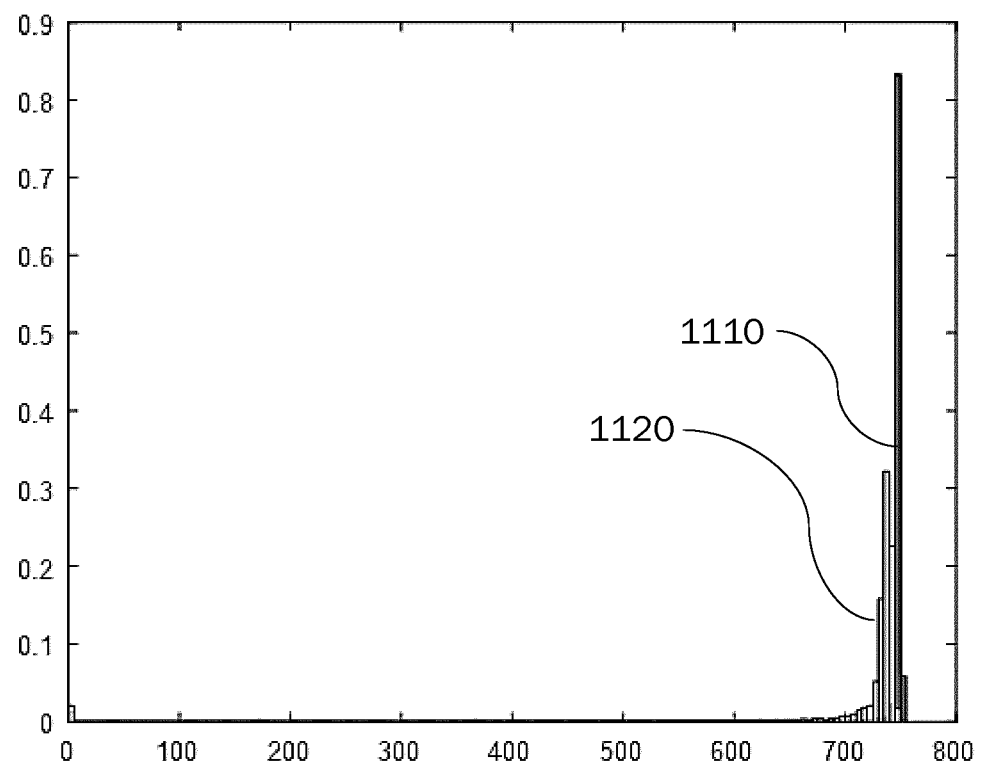

However, as has further been found, the sparsity in the frequency domain (spectral sparsity) is a suitable feature for discriminating portions of an audio signal that contain dense transient events (e.g., applause, crackling fire, rain, etc.) and that are improved by the fix from portions that contain dense transient events together with speech (including cheering) or music (and that may not be improved by the fix). This is illustrated in the histogram of FIG. 11 in which the horizontal axis indicates a (time-smoothed) measure of sparsity in the frequency domain, and the vertical axis indicates a (normalized) count of items per bin of the measure of sparsity in the frequency domain. For this histogram, the estimated number of frequency coefficients (e.g., MDCT lines) that are not quantized to zero is used as the measure of sparsity in the frequency domain. However, methods according to this disclosure are not limited to considering such measure of sparsity in the frequency domain, and other measures of sparsity in the frequency domain are feasible as well. Bin counts 1110 (dark grey) in the histogram relate to a set of audio items that have been manually classified as applause items that are improved by the fix, whereas bin counts 1120 (white) relate to a set of audio items that have been manually classified as applause containing speech (including cheering) and/or music. As can be seen from the histogram, the measure of sparsity in the frequency domain is consistently higher for the applause items than for the items relating to applause containing speech (including cheering) and/or music, so that the sparsity in the frequency domain can provide for suitable discrimination between the two classes of audio items.

Accordingly, the determination of whether the quantization mode that applies (e.g., enforces) a substantially constant signal-to-noise ratio over frequency shall be used for the portion of the audio signal may involve, in addition to the determination based on the value of the first feature (see, e.g., step S320 described above) comparing the value of the second feature (or, if available, the time-smoothed value of the second feature) to a predetermined threshold for the value of the first feature. This threshold may be determined manually, for example, to have a value that ensures reliable classification of audio items into applause items that are improved by the fix and items relating to applause containing speech (including cheering) and/or music. The quantization mode that applies (e.g., enforces) the substantially constant signal-to-noise ratio over frequency may be conditionally selected in accordance with (e.g., depending on) a result of the comparison. For example, the quantization mode that applies (e.g., enforces) the substantially constant signal-to-noise ratio over frequency may be selected if (e.g., only if) the value of the second feature (or the time-smoothed value of the second feature) is above the predetermined threshold for the second feature. Notably, reference to applause, as an example of an audio item containing dense transient events is made without intended limitation, and the present disclosure shall not be construed to be in any way limited by this reference.

In other words, in certain implementations, the decision of whether or not to select the quantization mode that applies (e.g., enforces) the substantially constant signal-to-noise ratio over frequency may be based on the result of the comparison of the (time-smoothed) value of the first feature to its respective threshold and/or the result of the comparison of the time variation of the value of the first feature to its respective threshold, and the result of the comparison of the (time-smoothed) value of the second feature to its respective threshold. For example, it may be determined that the quantization mode that applies (e.g., enforces) a substantially constant signal-to-noise ratio over frequency shall be used for the portion of the audio signal if (e.g., only if) the (time-smoothed) value of the first feature is above the predetermined threshold for the value of the first feature and/or the time variation of the value of the first feature is below the predetermined threshold for the time variation of the value of the first feature, and the (time-smoothed) value of the second feature is above the predetermined threshold for the value of the second feature.

On the other hand, if the aforementioned criteria of the determination are not met, a quantization mode that does not apply a substantially constant SNR over frequency (i.e., that applies different SNRs to different frequencies or frequency bands) may be selected at this point. In other words, the constant SNR quantization mode is conditionally applied depending on whether the aforementioned criteria of the determination are met.

Notwithstanding the above, relying on the value of the first feature alone in step S420 (as is done in step S320 in method 300, for example) may nevertheless produce an auditory result that is on the overall perceived as an improvement over conventional techniques for encoding dense transient events.

Step S430 in variation 400 corresponds to step S330 of method 300 in FIG. 3 and any statements made above with respect to this step apply also here.

Notably, also the form factor and the perceptually weighted form factor of (a portion of) an audio signal are computed during normal encoding operation of state-of-the-art audio encoders, such as AC-4, for example. Thus, relying on these features as a measure of sparsity in the frequency domain for purposes of selecting a quantization mode does not significantly add to complexity, delay, and memory footprint of the encoding process.

Next, a method 500 for detecting dense transient events (e.g., applause, crackling fire, rain, etc.) in a portion of an audio signal (e.g., for classifying a portion of an audio signal as to whether the portion is likely to contain dense transient events) according to embodiments of the disclosure will be described with reference to FIG. 5. Herein, it is understood that the portion is classified as likely to contain dense transient events if (e.g., only if) a probability that the portion contains dense transient events is found to exceed a predetermined probability threshold.

Step S510 in variation 500 corresponds to step S310 of method 300 in FIG. 3 and any statements made above with respect to this step apply also here.

At step S520, it is determined whether the portion of the audio signal is likely to contain dense transient events based at least in part on the value of the first feature. This step corresponds to the determination of, based at least in part on the value of the first feature, whether the quantization mode that applies (e.g., enforces) the substantially constant signal-to-noise ratio over frequency (e.g., for all frequency bands) shall be used for the portion of the audio signal in step S320 of method 300 in FIG. 3, except for that this determination is replaced by the determination of whether the portion of the audio signal is likely to contain dense transient events based at least in part on the value of the first feature. Otherwise, the details of the determination, in particular the determination criteria, are the same as in step S320 of method 300 in FIG. 3 and any statements made above with respect to this step apply also here.

An apparatus or module performing steps S510 and S520 may be referred to as a detector for detecting dense transient events.

At optional step S530, metadata is generated for the portion of the audio signal. The metadata may be indicative of whether the portion of the audio signal is likely to contain dense transient events (e.g., whether the portion of the audio signal is determined at step S520 to be likely to contain dense transient events). To this end, the metadata may include a binary decision bit (e.g., flag) for each portion of the audio signal, which may be set if the portion of the audio signal is (determined to be) likely to contain dense transient events.

Providing this kind of metadata enables downstream devices to perform more efficient and/or improved post processing with regard to dense transient events. For example, specific post processing for dense transient events may be performed for a given portion of the audio signal if (e.g., only if, or if and only if) the metadata indicates that the portion of the audio signal is likely to contain dense transient events.

However, the result of the determination (classification) of step S520 may also be used for other purposes apart from generating metadata, and the present disclosure shall not be construed as being limited to generating metadata that is indicative of the result of the determination (classification).

Figure 5:
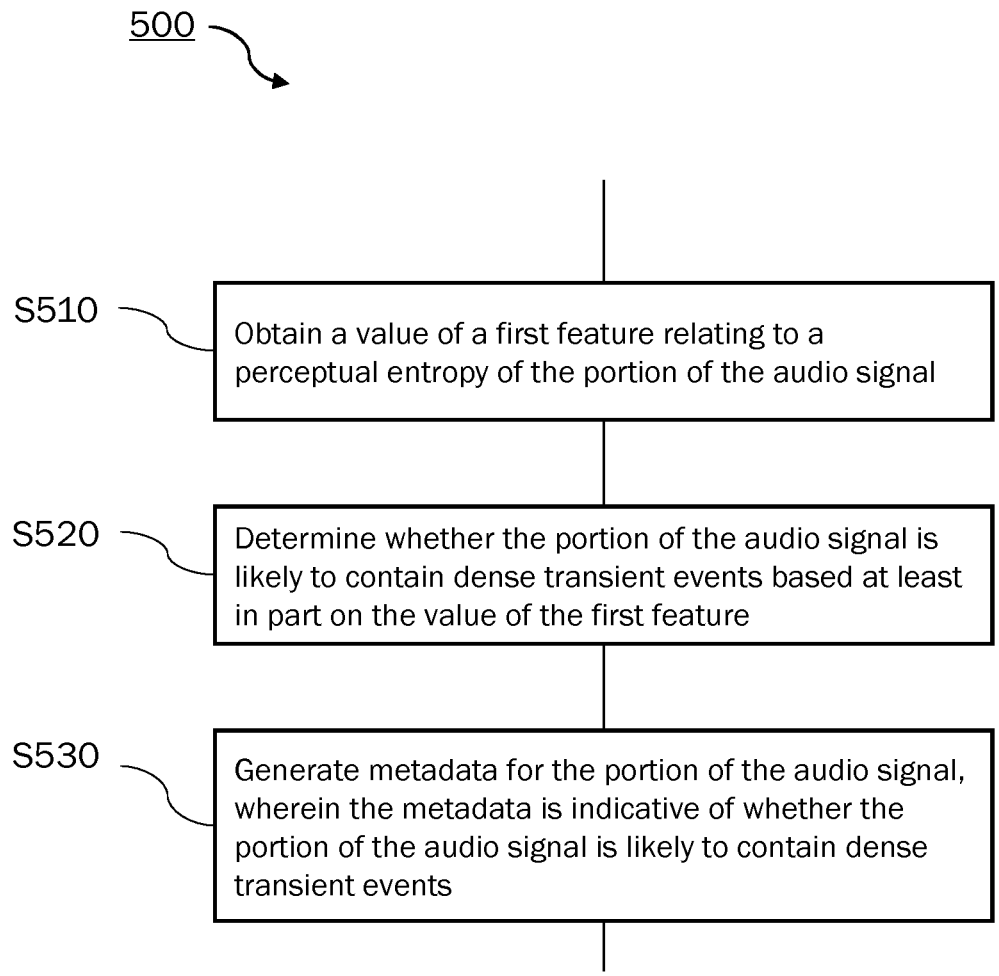
FIG. 5 is a flow chart illustrating an example of a method of detecting dense transient events in a portion of an audio signal according to embodiments of the disclosure.
Figure 6:
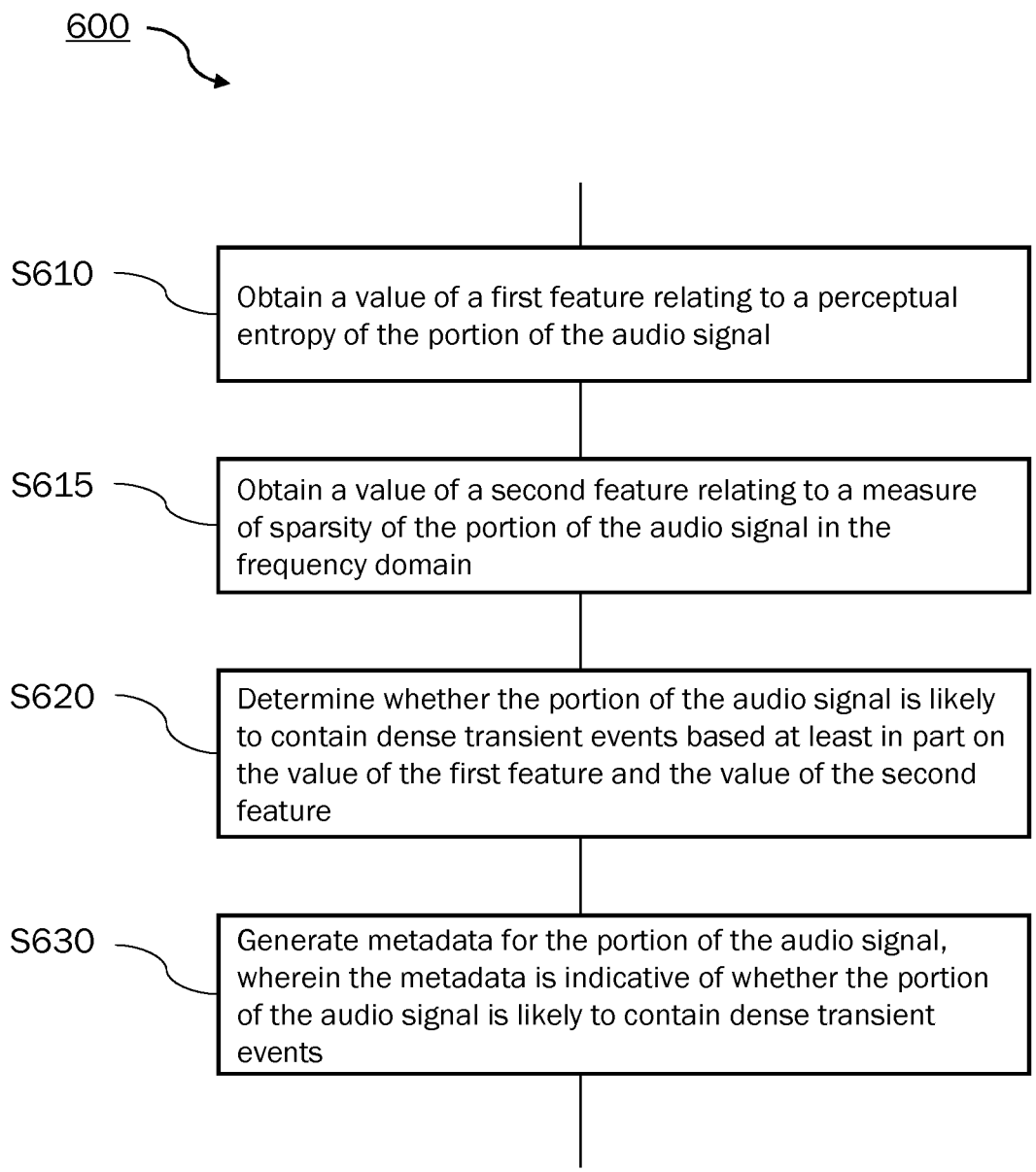
FIG. 6 is a flow chart illustrating an example of a variation of the method of FIG. 5.

FIG. 6 is a flow chart illustrating an example of a variation 600 of the method 500 of FIG. 5.

Step S610 in variation 600 corresponds to step S510 of method 500 in FIG. 5 (and thereby to step S310 of method 300 in FIG. 3 and step S410 of variation 400 in FIG. 4) and any statements made above with respect to this step (or these steps) apply also here.

Step S615 in variation 600 corresponds to step S415 of variation 400 of FIG. 4 and any statements made above with respect to this step apply also here.

At step S620, it is determined whether the portion of the audio signal is likely to contain dense transient events based (at least in part) on the value of the first feature and the value of the second feature. This step corresponds to the determination of, based at least in part on the value of the first feature and the value of the second feature, whether the quantization mode that applies (e.g., enforces) the substantially constant signal-to-noise ratio over frequency (e.g., for all frequency bands) shall be used for the portion of the audio signal in step S420 of variation 400 in FIG. 4, except for that this determination is replaced by the determination of whether the portion of the audio signal is likely to contain dense transient events based (at least in part) on the value of the first feature and the value of the second feature. Otherwise, the details of the determination, in particular the determination criteria, are the same as in step S420 of variation 400 in FIG. 4 and any statements made above with respect to this step apply also here.

Step S630 in variation 600 corresponds to step S530 in FIG. 5 and any statements made above with respect to this step apply also here.

Figure 7:
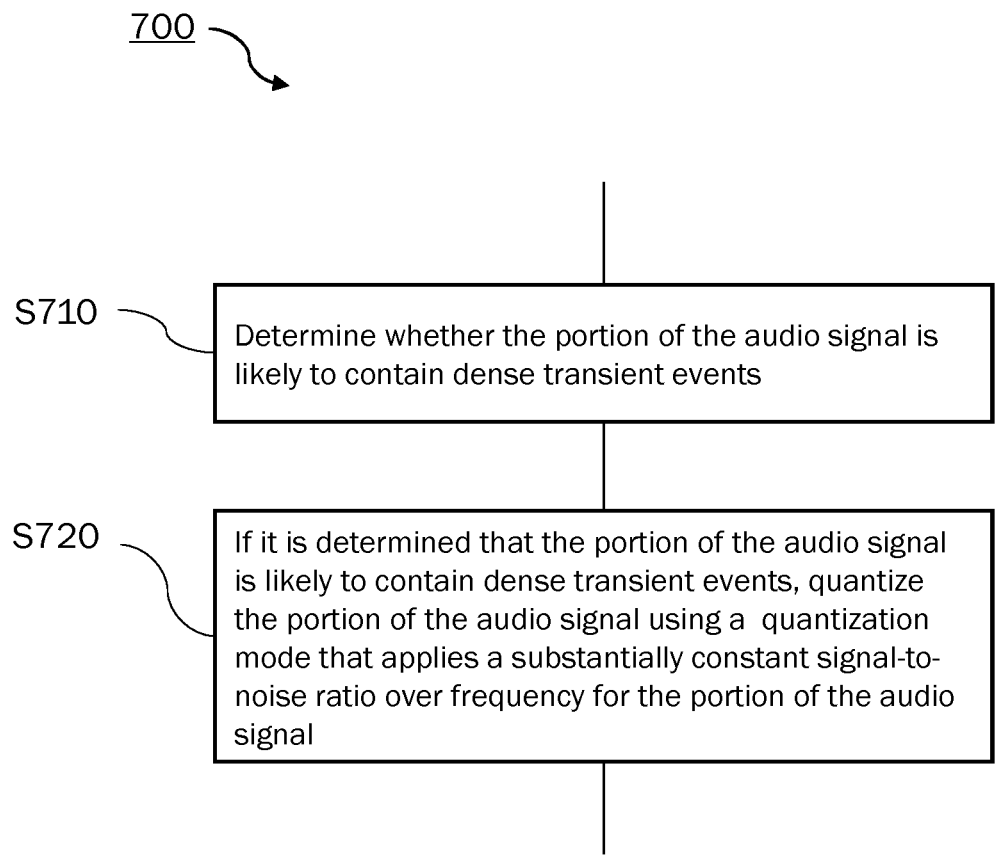
FIG. 7 is a flow chart illustrating an example of another method of encoding a portion of an audio signal according to embodiments of the disclosure.

Next, an example of another method 700 of encoding a portion (e.g., frame) of an audio signal according to embodiments of the disclosure will be described with reference to the flow chart of FIG. 7. This method may be advantageously applied for encoding portions of an audio signal that contain dense transient events, such as applause, crackling fire, or rain, for example.

At step S710, it is determined whether the portion of the audio signal is likely to contain dense transient events (e.g., applause, crackling fire, rain, etc.). This determination may involve the same criteria and decisions as the determination of, based at least in part on the value of the first feature, whether a quantization mode that applies a substantially constant signal-to-noise ratio over frequency shall be used for the portion of the audio signal in step S320 of method 300 in FIG. 3 or the determination of, based at least in part on the value of the first feature and the value of the second feature, whether a quantization mode that applies a substantially constant signal-to-noise ratio over frequency shall be used for the portion of the audio signal in step S420 of variation 400 in FIG. 4. Accordingly, this step may comprise obtaining the value of the first feature (e.g., in the manner described with reference to step S310 of method 300 in FIG. 3) and/or obtaining the value of the second feature (e.g., in the manner described with reference to step S415 of variation 400 in FIG. 4). However, the present disclosure is not limited to these determinations, and other processes for determining whether the portion of the audio signal is likely to contain dense transient events are feasible as well.

At step S720, if (e.g., only if) it is determined that the portion of the audio signal is likely to contain dense transient events, the portion of the audio signal is quantized using a quantization mode that applies a (substantially) constant signal-to-noise ratio over frequency for the portion of the audio signal. In other words, the constant SNR quantization mode is conditionally applied depending on whether the portion of the audio signal is determined to be likely to contain dense transient events. The quantization mode that applies the (substantially) constant SNR has been described above, for example with reference to step S330 of method 300 in FIG. 3.

As indicated above, the quantization mode that applies the (substantially) constant signal-to-noise ratio over frequency for the portion of the audio signal (constant SNR quantization mode) is particularly suitable for encoding portions of an audio signal that contain dense transient events. The determination at step 710 ensures that portions of the audio signal for which the constant SNR quantization mode is not suitable are not quantized using this quantization mode, thereby avoiding degradation of such portions.

It is understood that the proposed methods of encoding a portion of an audio signal and of detecting dense transient events in a portion of an audio signal may be implemented by respective suitable apparatus (e.g., encoders for encoding a portion of an audio signal). Such apparatus (e.g., encoder) may comprise respective units adapted to carry out respective steps described above. For instance, such apparatus for performing method 300 may comprise a first feature determination unit adapted to perform aforementioned step S310 (and likewise aforementioned steps S410, S510, and S610), a quantization mode selection unit adapted to perform aforementioned step S320, and a quantization unit adapted to perform aforementioned step S330 (and likewise aforementioned steps S430 and S720). Likewise, an apparatus for performing variation 400 of method 300 may comprise the first feature determination unit, a second feature determination unit adapted to perform aforementioned step S415, a modified quantization mode selection unit adapted to perform aforementioned step S420, and the quantization unit. An apparatus for performing method 500 may comprise the first feature determination unit, an audio content determination unit adapted to perform aforementioned step S520, and optionally a metadata generation unit adapted to perform aforementioned step S530 (and likewise aforementioned step S630). An apparatus for performing variation 600 of method 500 may comprise the first feature determination unit, the second feature determination unit, a modified audio content determination unit adapted to perform aforementioned step S620, and optionally the metadata generation unit. An apparatus for performing method 700 may comprise a dense transient event detection unit adapted to perform aforementioned step S710, and the quantization unit. It is further understood that the respective units of such apparatus (e.g., encoder) may be embodied by a processor of a computing device that is adapted to perform the processing carried out by each of said respective units, i.e. that is adapted to carry out each of the aforementioned steps. This processor may be coupled to a memory that stores respective instructions for the processor.

It should be noted that the description and drawings merely illustrate the principles of the proposed methods and apparatus. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and apparatus and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The methods and apparatus described in the present disclosure may be implemented as software, firmware and/or hardware. Certain components may e.g. be implemented as software running on a digital signal processor or microprocessor. Other components may e.g. be implemented as hardware and or as application specific integrated circuits. The signals encountered in the described methods and apparatus may be stored on media such as random access memory or optical storage media. They may be transferred via networks, such as radio networks, satellite networks, wireless networks or wireline networks, e.g. the Internet.

The invention claimed is:

1. A method of encoding a portion of an audio signal, the method comprising:
   determining whether the portion of the audio signal is likely to contain dense transient events; and
   if it is determined that the portion of the audio signal is likely to contain dense transient events, quantizing the portion of the audio signal using a quantization mode that applies a constant signal-to-noise ratio over frequency for the portion of the audio signal.

2. The method of claim 1, further comprising obtaining a value of a first feature relating to a perceptual entropy of the portion of the audio signal, wherein said determining is based at least in part on the value of the first feature.

3. The method of claim 1, further comprising obtaining a value of a second feature relating to a measure of sparsity in the frequency domain of the portion of the audio signal,
   wherein said determining is further based on the value of the second feature.

4. The method of claim 2, further comprising smoothing the value of the first feature over time to obtain a time-smoothed value of the first feature, wherein said determining is based on the time-smoothed value of the first feature.

5. The method of claim 2,
   wherein said determining involves comparing the value of the first feature to a predetermined threshold for the value of the first feature; and said quantization mode that applies the constant signal-to-noise ratio over frequency is selected if the value of the first feature is above the predetermined threshold for the value of the first feature.

6. The method of claim 2, wherein said determining is based on a variation over time of the value of the first feature.

7. The method of claim 6,
wherein said determining involves comparing the variation over time of the value of the first feature to a predetermined threshold for the variation; and
said quantization mode that applies the constant signal-to-noise ratio over frequency is selected if the variation of the value of the first feature is below the predetermined threshold for the variation.

8. The method of claim 3, further comprising smoothing the value of the second feature over time to obtain a time-smoothed value of the second feature, wherein said determining is based on the time-smoothed value of the second feature.

9. The method of claim 3,
wherein said determining involves comparing the value of the second feature to a predetermined threshold for the value of the second feature; and
said quantization mode that applies the constant signal-to-noise ratio over frequency is selected if the value of the second feature is above the predetermined threshold for the value of the second feature.

10. The method of claim 2, wherein the first feature is proportional to the perceptual entropy; and optionally the value of the first feature is obtained in the frequency domain.

11. A method of encoding a portion of an audio signal, the method comprising:
obtaining a value of a first feature relating to a perceptual entropy of the portion of the audio signal;
selecting a quantization mode for quantizing the portion of the audio signal based on the value of the first feature; and
quantizing the portion of the audio signal using the selected quantization mode,
wherein selecting the quantization mode involves determining, based at least in part on the value of the first feature, whether a quantization mode that applies a constant signal-to-noise ratio over frequency shall be used for the portion of the audio signal.

12. The method of claim 11, further comprising:
obtaining a value of a second feature relating to a measure of sparsity in the frequency domain of the portion of the audio signal,
wherein said determining is further based on the value of the second feature; and/or
wherein said determining is based on a variation over time of the value of the first feature; and/or
wherein the first feature is proportional to the perceptual entropy.

13. A method of detecting dense transient events in a portion of an audio signal, the method comprising:
obtaining a value of a first feature relating to a perceptual entropy of the portion of the audio signal; and
determining whether the portion of the audio signal is likely to contain dense transient events based at least in part on the value of the first feature.

14. The method of claim 13, further comprising:
generating metadata for the portion of the audio signal, wherein the metadata is indicative of whether the portion of the audio signal is likely to contain dense transient events; and/or
obtaining a value of a second feature relating to a measure of sparsity in the frequency domain of the portion of the audio signal, wherein said determining is further based on the value of the second feature; and/or
wherein said determining is based on a variation over time of the value of the first feature; and/or
wherein the first feature is proportional to the perceptual entropy.

15. An apparatus comprising a processor and a memory coupled to the processor and storing instructions for execution by the processor, wherein the processor is adapted to perform the method of claim 1.

16. An apparatus comprising a processor and a memory coupled to the processor and storing instructions for execution by the processor, wherein the processor is adapted to perform the method of claim 11.

17. An apparatus comprising a processor and a memory coupled to the processor and storing instructions for execution by the processor, wherein the processor is adapted to perform the method of claim 13.

18. A non-transitory computer-readable storage medium comprising a sequence of instructions, wherein the instructions, when executed by one or more processors, cause the one or more processors to perform the method of claim 1.

19. A non-transitory computer-readable storage medium comprising a sequence of instructions, wherein the instructions, when executed by one or more processors, cause the one or more processors to perform the method of claim 11.

20. A non-transitory computer-readable storage medium comprising a sequence of instructions, wherein the instructions, when executed by one or more processors, cause the one or more processors to perform the method of claim 13.

21. The method of claim 1, further comprising, if it is determined that the portion of the audio signal is not likely to contain dense transient events, quantizing the portion of the audio signal using a quantization mode that does not apply a constant SNR over frequency.

* * * * *